United States Patent [19]

Yoshida et al.

[11] Patent Number: 4,566,941

[45] Date of Patent: Jan. 28, 1986

[54] REACTIVE ION ETCHING METHOD

[75] Inventors: Yukimasa Yoshida, Kawasaki; Tohru Watanabe, Tokyo, both of Japan

[73] Assignee: Kabushiki Kaisha Toshiba, Kawasaki, Japan

[21] Appl. No.: 608,449

[22] Filed: May 9, 1984

[30] Foreign Application Priority Data

May 10, 1983 [JP] Japan ................................. 58-81309
Sep. 14, 1983 [JP] Japan ............................... 58-169889

[51] Int. Cl.⁴ ...................... H01L 21/306; B44C 1/22; C03C 15/00; C23F 1/02
[52] U.S. Cl. .................................. 156/643; 156/646; 156/656; 156/657; 156/659.1; 156/662; 156/345; 204/192 E; 204/298
[58] Field of Search ............... 156/643, 646, 656, 657, 156/659.1, 662, 345; 204/192 E, 298, 164; 427/38, 39; 252/79.1

[56] References Cited

U.S. PATENT DOCUMENTS 4,207,137 1/1980 Tretola ........................... 156/643 X
4,349,409 9/1982 Shibayama et al. ............. 156/345 X Primary Examiner—William A. Powell
Attorney, Agent, or Firm—Finnegan, Henderson, Farabow, Garrett & Dunner

[57] ABSTRACT

A reactive ion etching method utilizing high frequency voltage wherein cathode drop voltage developed in the vicinity of an electrode disposed for impressing a high frequency power is gradually reduced immediately before stopping the impression of high frequency power at the end of ion etching process, thereby reducing the voltage impressed on an insulation layer within a semiconductor wafer below the breakdown voltage of the insulation layer.

6 Claims, 10 Drawing Figures

REACTIVE ION ETCHING METHOD

BACKGROUND OF THE INVENTION

1. Field of the Invention

This invention relates to a reactive ion etching method applied in the process of manufacturing a semiconductor, and more particularly, to a method of etching an object mass containing an interposed thin insulation layer prepared from silicon dioxide, silicon nitride or the like.

2. Description of the Prior Art

As a semiconductor integrated circuit increases in density, the patterned size of its gate material and wiring material is reduced to less than 1 micron. For the formation of such an extremely fine pattern, reactive ion etching is now considered indispensable as an art of effectively etching exactly the true patterned size of, for example, a resist mask. This reactive ion etching allows for anisotropic etching. The fundamental principle of said reactive ion etching (illustrated in FIG. 1) is described below. High frequency power is impressed in a decompressed condition between a pair of flat parallel electrode plates which are set opposite each other (namely, the upper electrode plate 1, for example, is grounded, and high frequency power is impressed on the lower electrode plate 2, which is parallel to said upper electrode plate 2, from a high frequency power source 3 through an impedance matching device 4 and blocking capacitor 5). At this time, discharge takes place between both electrode plates 1, 2, giving rise to the distribution of D.C. potential between said electrode plates 1, 2. As a result, a noticeable D.C. potential difference (cathode drop voltage $V_{dc}$) arises particularly in the vicinity of the lower electrode plate 2 which has been impressed with high frequency power. Referring to the above-mentioned D.C. potential distribution, $V_p$ denotes plasma potential. Positive voltage is impressed on the plasma side, while negative voltage is impressed on the lower electrode plate. The above-mentioned cathode drop voltage $V_{dc}$ arises from the fact that after the start of the discharge, a larger amount of electrons than positive ions is carried into the lower electrode plate 2, and consequently, the electrons are stored in said lower electrode plate 2. The magnitude of said cathode drop voltage $V_{dc}$ is determined by the difference between the mobilities of ions and electrons and the area ratio between cathode and anode. When, therefore discharge takes place in a reactive gas atmosphere mainly consisting of a halogen, the positive ions of the halogen are accelerated by the cathode drop voltage $V_{dc}$ in a D.C. field and are carried into the lower electrode plate 2 impressed with high frequency power or into an object to be etched placed on said lower electrode plate 2. Further description may now be made with reference to FIG. 2. Ions 8 of a reactive gas are not carried into that portion of the object of etching 6 in which the mask material 7 is mounted, namely, that portion thereof which is concealed by said mask material 7. Therefore, anisotropic etching true to the patterned size of a mask is effected.

In connection with the above-mentioned reactive ion etching process, reference is made to three conductive layers mounted on a semiconductor substrate with a thin insulation layer interposed therebetween. In this case, it sometimes happens that in the breakdown voltage test after etching, the damage to said insulation layer is detected.

Particularly in the case of, for example, an LSI element, high integration results in a decrease in the minimum width of said element, and further causes the thickness of an oxide gate membrane to be reduced to, for example, 400 Å at 64 KDRAM, or 250 Å at 256 KDRAM. When the aforementioned plasma etching was applied to a polycrystalline silicon layer, a refractory metal layer, or layer consisting of refractory metal silicide which was deposited on such an extremely thin oxide layer, then the underlying oxide layer was noticeably reduced in its breakdown voltage, thus failing to fully function as an insulation layer. In this connection, experimental data is set forth in FIG. 3A on the frequency of the damage to the oxide insulation layer. In comparison, FIG. 3B indicates experimental data on the frequency of the damage to the oxide insulation layer when the aforementioned polycrystalline silicon layer, the refractory metal layer, or the layer consisting of refractory metal silicide deposited on the extremely thin gate oxide layer was subjected to a chemical dry-etching process giving rise to no accumulation of electrical charge. Etching was applied to a phosphorus-doped polysilicon layer deposited on a silicon wafer with a gate oxide having a thickness of 400 Å. FIGS. 3A and 3B indicate the relationship between the gate breakdown voltage (a breakdown electrical field as converted per 1 cm of thickness) and the number of damaged samples. The above-mentioned data clearly show that the reactive ion etching process damages the gate insulation layers on a larger number of samples in a region of lower voltage than the chemical dry etching process.

SUMMARY OF THE INVENTION

This invention has been accomplished in view of the above-mentioned circumstances, and is intended to provide a reactive ion etching method which can effect the anisotropic etching of an object without damaging the thin insulation layer included in said object of etching.

To attain the above-mentioned object, this invention provides a reactive ion etching method which comprises the steps of mounting an object of etching comprising 3-ply structure consisting of a conductive layer formed on a semiconductor substrate with a thin insulating layer interposed therebetween, and impressing high frequency power between a pair of mutually facing electrodes in an atmosphere of reactive gas to etch said object. After the etching and immediately before stopping the impressing of said high frequency power, gradual reduction is effected in the cathode drop voltage, arising in the proximity of that electrode to which said high frequency power is supplied. Upon stopping the supply of high frequency power, voltage impressed on the insulation layer included in the object of etching by the reverse flow of an electrical charge accumulated in the lower electrode; is made to fall below the breakdown voltage of said insulation layer. Thereafter, the impression of said high frequency power is stopped.

The present inventors searched for the cause of the damage to an insulation layer occurring during one reactive etching, and discovered that when the impression of high frequency power was stopped after one completion of etching, an electrical charge accumulated in the lower electrode 2 made a reverse flow, as previously described, and converged toward both sides of the insulation layer included in the object of etching.

When said concentration grow noticeably, the insulation layer was damaged. For instance when etching was carried out by supplying a high frequency power of 500 watts and said supply was stopped without taking any precautionary measure, a peak value of voltage temporarily impressed on the insulation layer substantially corresponded to the cathode drop voltage $V_{dc}$ (approximately 225 V as determined from FIG. 4), a sufficiently high enough level to damage the insulation layer.

The present inventors further noticed that the magnitude of the cathode drop voltage $V_{dc}$ depended on the level of the high frequency power, the pressure of reactive atmospheric gas, and the ratio between the areas of the anode and cathode of an etching apparatus. The inventors succeeded in preventing the deterioration of the breakdown voltage of the underlying insulation layer by the steps of controlling the abovementioned factors immediately before stopping the impression of the high frequency power, gradually reducing the cathode drop voltage $V_{dc}$ below a prescribed level, and finally stopping the impression of the high frequency power. FIG. 4 indicates the relationship between the cathode drop voltage $V_{dc}$ and high frequency power and proves that said cathode drop voltage $V_{dc}$ is directly proportional to the high frequency power. FIG. 5 shows the relationship between the level of the cathode drop voltage $V_{dc}$ and the pressure of the reactive atmospheric gas and proves that said cathode drop voltage $V_{dc}$ is inversely proportional to the pressure of the reactive atmospheric gas. FIG. 5 shows a curve determined when a composite gas, consisting of 20 SCCM of $Cl_2$ and 6 SCCM of $H_2$, was introduced and an RF power of 500 W (0.3 W/cm$^2$) was applied.

Description may now be made of the relationship between the ratio which the area of the anode bears to that of the cathode and the cathode drop voltage $V_{dc}$. Let it be assumed that $A_a$ denotes the area of the anode, $A_c$ represents the area of the cathode, and $V_a$ shows the level of reduced voltage on the anode. Then the following equation results:

$$\frac{V_{dc}}{V_a} = \left(\frac{A_a}{A_c}\right)^\alpha$$

where:
$\alpha = 2$ to 4
$V_a$ = a difference between the potentials of the plasma and anode and, when the anode is grounded, a value equal to a plasma potential $V_p$ (that is, $V_a = V_p$)

In the ordinary RIE, the equation $A_a >> A_c$ is established. $V_{dc}$ generally has a large value. When, however, the ratio between the areas of $A_c$ and $A_a$ is so reduced as to approach 1, when $V_{dc}$ can fall to the proximity of $V_p$. $V_p$ stands at 20 to 30 volts under ordinary conditions. The concrete process of decreasing the ratio of $A_a/A_c$ should advisably be carried out by the steps of reducing the interelectrode distance and reducing the area of the wall of the plasma etching device (which acts as an anode when grounded).

DETAILED DESCRIPTION OF THE PREFERRED EMBODIMENTS

A description may now be made with reference to the accompanying drawings of a reactive ion etching method embodying this invention.

Figure 6:
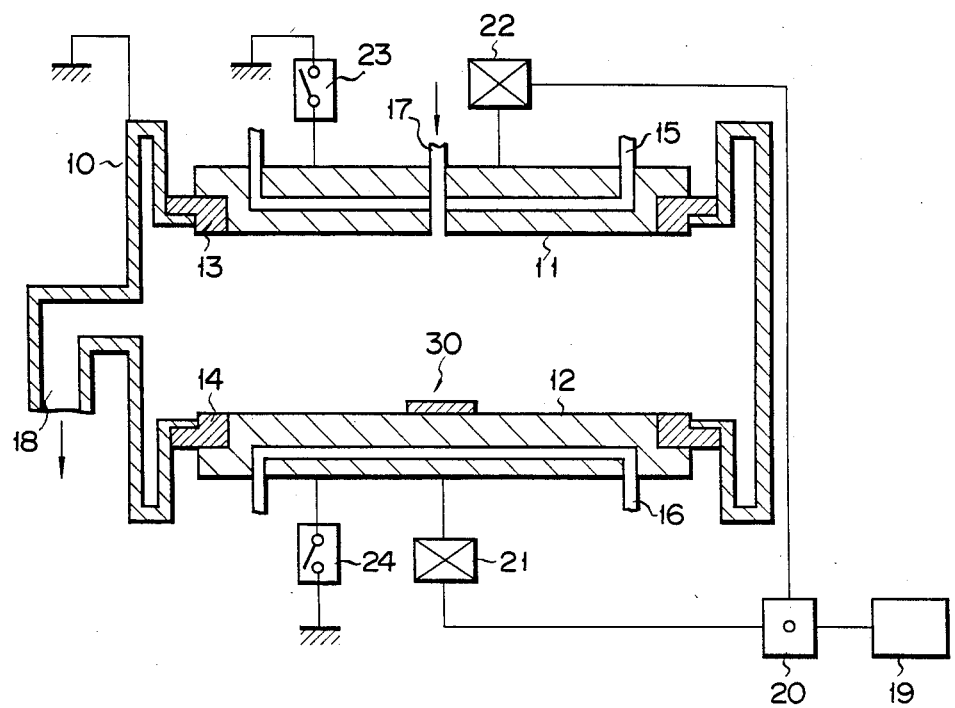
FIG. 6 is a cross sectional view of a plasma etching apparatus used in the reactive ion etching method embodying this invention.

FIG. 6 is a cross sectional view of a plasma etching apparatus used in the reactive ion etching method embodying this invention. Reference numeral 10 is a stainless steel vacuum vessel. Provided in parallel in the vacuum vessel 10 are an upper plate electrode 11 and a lower plate electrode 12 which constitute part of the wall of said vacuum vessel 10. The plate electrodes 11, 12 are insulated from the vacuum vessel 10 by the corresponding Teflon rings 13, 14. An object of etching 30 is mounted on the lower plate electrode 12. The plate electrodes 11, 12 are respectively cooled by water running through cooling pipes 15, 16 penetrating said plate electrodes 11, 12. Reactive gas is taken into the vacuum vessel 10 through an inlet 17 formed in the center of the upper plate electrode 11. The vacuum vessel 10 is evacuated by, for example, a rotary pump (not shown) through an exhaust pipe 18 provided below the vacuum vessel 10. An output from the RF power source 19 is supplied to the upper plate electrode 11 or lower plate electrode 12 through the corresponding, matching apparatuses 21, 22 by means of a changeover switch 20. The vacuum vessel 10 is always grounded. The plate electrode 11 or 12, which is not impressed with high frequency power, is grounded by one corresponding changeover switch 23 or 24.

Figure 7:
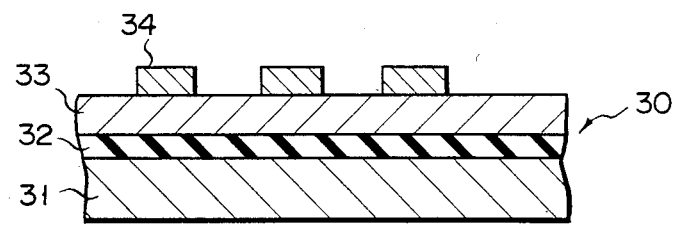
FIG. 7 is a cross sectional view of an object of etching used in the subject reactive ion etching method.

FIG. 7 is a cross sectional view of an object of etching 30 etched by the method of this invention and involving the application of the aforementioned plasma etching apparatus. Said object of etching 30 is a mass constructed by growing an oxide layer 32 having a thickness of 400 Å on a 4-inch P type single crystal silicon substrate 31 by a thermal oxidation process, and further depositing a polycrystalline silicon layer 33 with a thickness of 4000 Å on said thermally oxidized layer 32. Said polycrystalline silicon layer 33 is doped with diffused phosphorus. A resist layer 34 having a prescribed pattern is formed on the surface of said doped polycrystalline silicon layer 33. In this case, it is possible to apply an insulation layer, for example, a thermally grown silicon nitride layer, in place of said thermally oxidized layer 32. The polycrystalline silicon layer 33 is marked with a resist layer 34 to expose a region of etching. The etching region may be formed not only in a polycrystalline silicon layer, but also an amorphous silicon layer, a refractory metal layer, a metal silicide compound layer, a laminate consisting of said polycrystalline silicon layer and refractory metal layer, or a laminate formed of said polycrystalline silicon layer and silicide compound layer.

When work is applied to the polycrystalline silicon layer 33 deposited on the thin insulation layer 32, and thereafter an insulation layer (for example, a CVD $SiO_2$ layer) superposed over said polycrystalline silicon layer 33 is subjected to reactive ion etching, or reactive ion etching is applied to a conductive layer of, for example, aluminum alloy mounted on said insulation layer, the reactive ion etching method of this invention can be applied.

The application of the subject reactive ion etching by the aforementioned apparatus is carried out by the following steps. First, the vacuum vessel 10 is evacuated by an evacuation pump through the exhaust pipe 18 to maintain the degree of vacuum in the vacuum vessel 10 at a prescribed level (for example, 0.08 Torr). A reactive gas (in the case of this invention, a gaseous mixture of $Cl_2$ and $H_2$) is taken into the vacuum vessel 10. High frequency power of, for example, 500 watts is impressed on the lower electrode 12 from a high frequency power source 19 through impedance matching devices 21, 22. As a result, discharge arises between the upper and lower electrodes 11, 12, giving rise to the aforementioned distribution of D.C. potential in the area defined between both electrodes 11, 12. Cathode drop voltage $V_{dc}$ is applied particularly in the proximity of the lower electrode 12. The positive ions of the reactive gaseous mixture are accelerated and perpendicularly brought into the surface of a wafer mounted on the lower electrode 12. As a result, the phosphorus-doped polysilicon layer (gate material) formed on the wafer is anisotropically etched.

Figure 1:
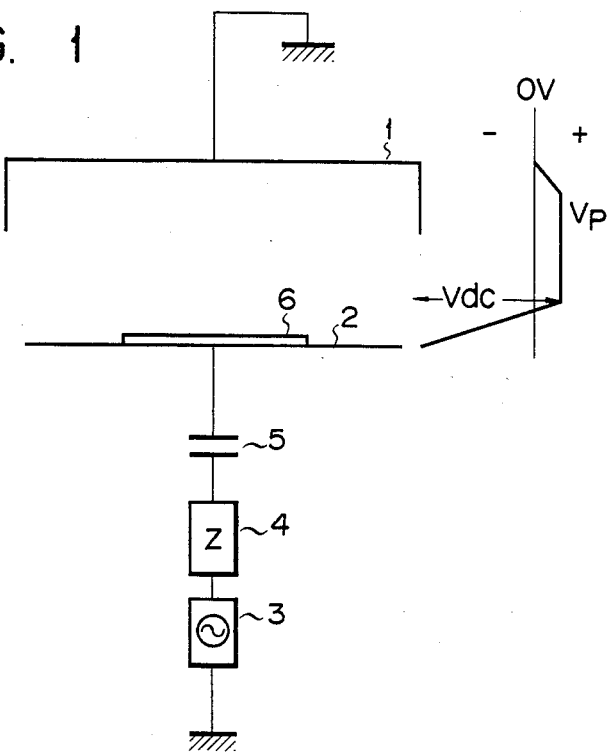
FIG. 1 illustrates the fundamental principle of the reactive ion etching method.
Figure 2:
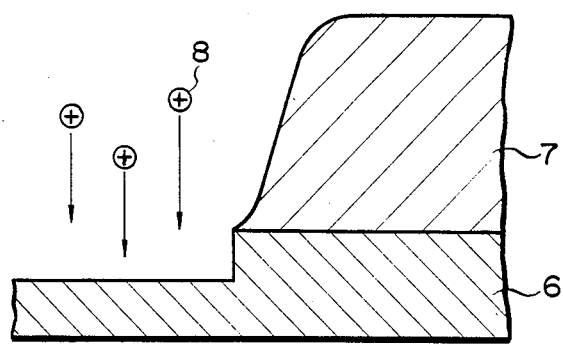
FIG. 2 is a cross sectional view of an object of etching subjected to anisotropic etching.
Figure 3A:
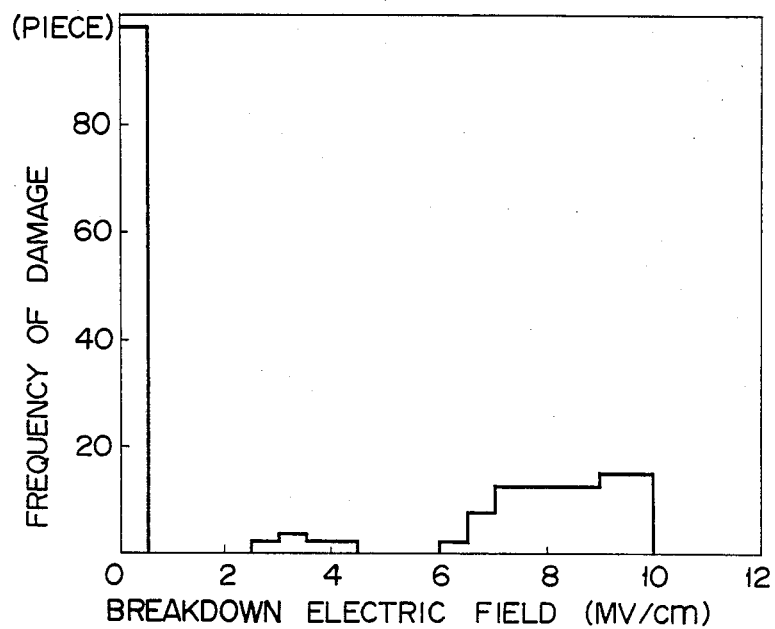
FIGS. 3A and 3B, respectively, graphically show the experimental data on the damage to an insulation layer, included in an object of etching, when subjected to the reactive ion etching and chemical dry etching.
Figure 3B:
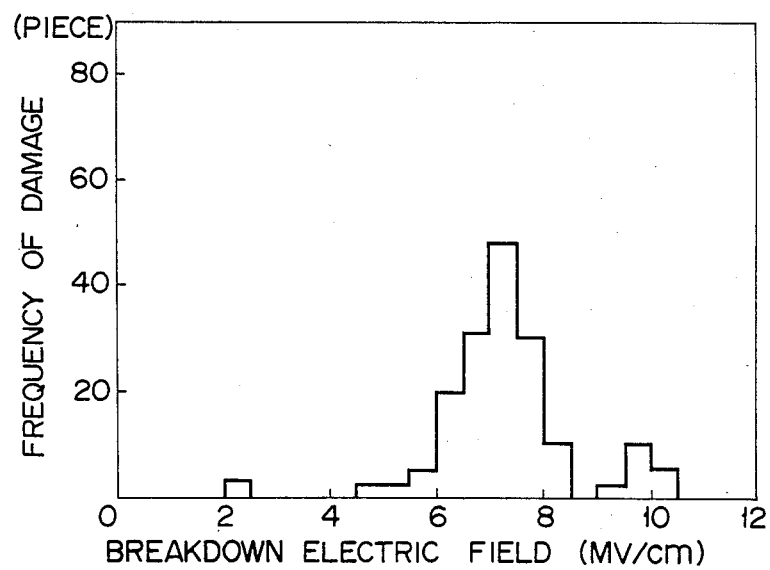
Figure 4:
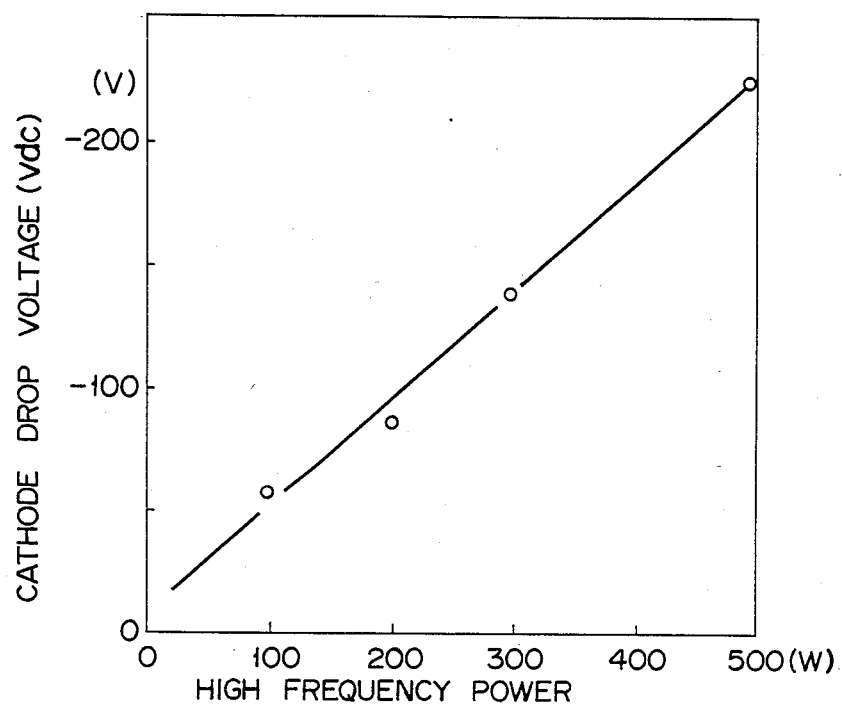
FIG. 4 is a curve diagram showing the relationship between the level of the cathode drop voltage occurring in the proximity of the lower electrode of FIG. 1 and the magnitude of high frequency power.
Figure 5:
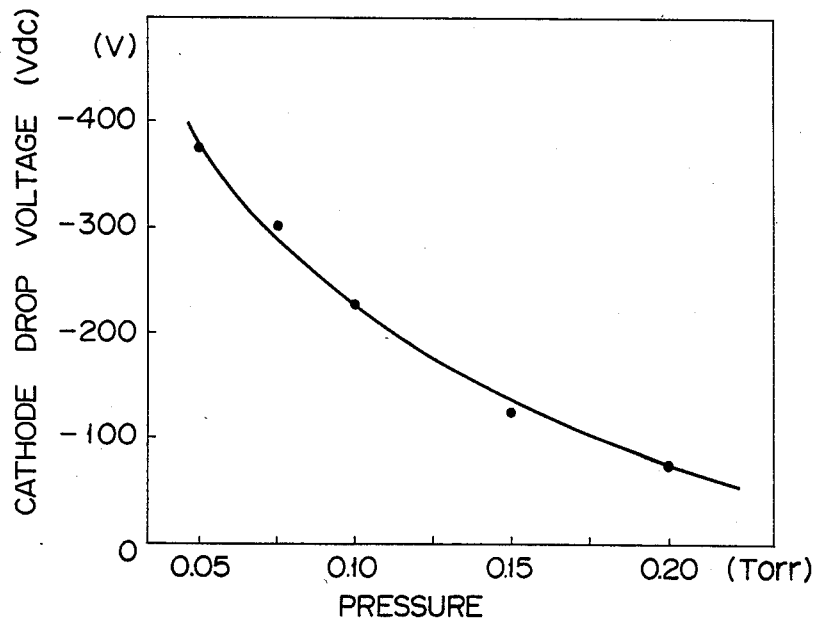
FIG. 5 graphically indicates the relationship between the cathode drop voltage $V_{dc}$ and the pressure of the reactive atmospheric gas.
Figure 8:
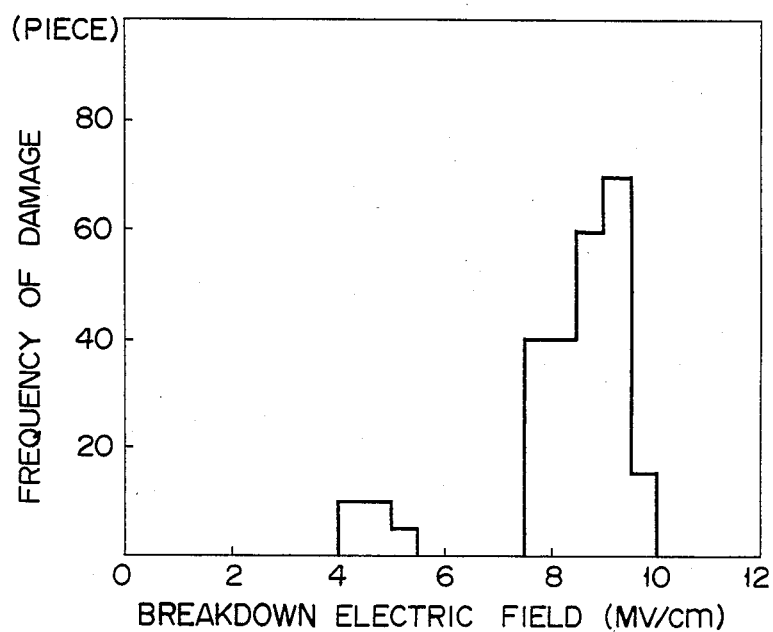
FIGS. 8 and 9, respectively, graphically show the relationship between the frequency of the damage to an insulation layer and the level of a breakdown electrical field.

Further according to the reactive ion etching method of this invention, the high frequency power is gradually decreased to about 50 watts immediately before the impression of the high frequency voltage is stopped after the completion of etching. This enables the total voltage stored in a capacitor surrounding the gate insulation layer to drop to a lower level than the breakdown voltage of the gate insulation layer (when the gate insulation layer has a thickness of 400 Å, its breakdown voltage ranges between 30 and 40 volts). If, thereafter, the impression of the high frequency voltage is stopped, it is possible to prevent transitory, excessively high voltage from being impressed on the gate insulation layer, thereby substantially eliminating the damage of said gate insulation layer. The cathode drop voltage $V_{dc}$ arising when the high frequency power is reduced to 50 watts, as described above, substantially stands at 25 volts as seen from FIG. 4. FIG. 8 shows the experimental data on the frequency of the damage to the insulation layer which arises from stopping the impression of high frequency power. A comparison between said experimental data and the data of FIG. 3A, obtained from the conventional reactive ion etching method, clearly proves that the reactive ion etching method of this invention ensures a noticeable decrease in the frequency of damage to the insulation layer occurring in a small breakdown electrical field.

A description may now be made of another example of this invention in which the cathode drop voltage $V_{dc}$ was made to drop by varying the pressure of a reactive atmospheric gas. First, an object of etching 30 was set at the prescribed spot on the surface of the lower electrode 12 as shown in FIG. 6. Etching was applied to an object of etching 30, formed of a polycrystalline silicon layer 33, under the following conditions. A gaseous mixture consisting of 20 SCCM of $Cl_2$ and 6 SCCM of $H_2$ was taken into the vacuum vessel 10 in such a manner that the pressure of the interior of said vacuum vessel 10 stood at 0.07 Torr. The radio frequency power source 19 supplied a power of 13.56 Hz 0.3 w/cm² to the lower electrode 12. Under the above-mentioned condition, etching was carried out with a resist layer used as a mask. The cathode drop voltage $V_{dc}$ reached 300 volts, and anisotropic etching was applied to the polycrystalline silicon layer 33. The flow rate of the reactive gas was increased 5 seconds before the radio frequency power source 19 ceased to supply power, thereby increasing the pressure of the interior of the vacuum vessel 10 to 0.2 Torr. At this time, the cathode drop voltage dropped to a lower level than 100 volts. After this condition was maintained for several seconds, the radio frequency power source 19 stopped operation, thereby bringing the subject etching to an end. In this case, the process of elevating the pressure of the interior of the vacuum vessel 10 may be carried out not only by increasing the flow rate of the reactive etching gas, but also by introducing other gas into the vacuum vessel 10 or by throttling the valve of the evacuation system.

Figure 9:
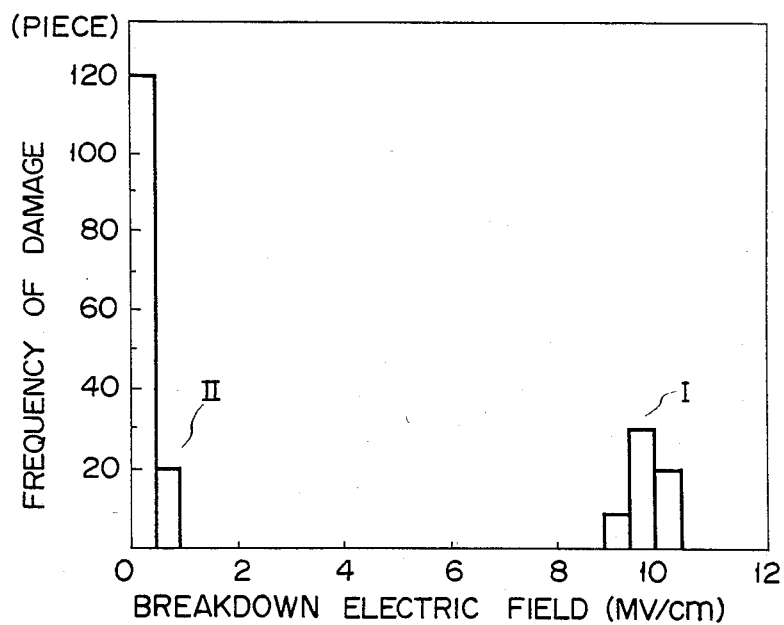

After being subjected to the reactive ion etching, the object body 30 was washed with a solution containing sulfuric acid to remove the resist layer 34. Thereafter, determination was made of the distribution of the breakdown electrical field of the thermally oxidized layer 32; the results being set forth by a numeral I given in FIG. 9. This FIG. 9 shows that the breakdown electrical field of the thermally oxidized layer 32 indicated a voltage of 10 MV/cm, substantially equal to its intrinsic breakdown voltage. Now let it be assumed that the electrode of the polycrystalline silicon layer 33 has an area of 10 mm², and that when a given level of voltage is impressed on said electrode, a current of 1 $\mu$A flows through said electrode. As used herein, the breakdown electrical field is defined to have a voltage represented by a value arrived at by dividing said current of 1 $\mu$A by the thickness of the thermally oxidized layer 32 (assumed to be 400 Å). Following is the reason why the breakdown electric field of the thermally oxidized layer 32 has such a high value. When the pressure of the interior of the vacuum was raised immediately before the radio frequency power source 19 ceased to be operated, the cathode drop voltage $V_{dc}$ was reduced. Therefore, an electrical charge accumulated in a block condenser (not shown), interposed between the matching device 21 and the lower electrode 12, was gradually discharged. Thereafter the radio frequency power source 19 stopped operation. As a result, it is supposed that a highly intensive electrical field was prevented from being applied to the front and back planes of the thermally oxidized layer 32 as a transitory current.

To effect comparison with the reactive ion etching method of this invention, a plasma etching apparatus and object of etching 30 with having the same type as described above were provided. Said object of etching 30 was etched under the same conditions as applied in the etching method of the invention. In the case of this control, however, the pressure of the interior of the vacuum vessel 10 was not increased. But etching was brought to an end when the radio frequency power source 19 ceased to be operated. Thereafter, the resist layer 34 was removed by a solution containing sulfuric acid. A voltage determination was made of the yield electrical field produced in the case of the above-mentioned control; the results being set forth in FIG. 9, II. This FIG. 9, II clearly shows that the breakdown electrical field produced in the case of the above-mentioned control had a lower voltage than 1 MV/cm, disclosing that the breakdown electric field was noticeably deteriorated as compared with that which is realized in the reactive ion etching of this invention.

As mentioned above, the subject reactive ion etching method offers the advantage that an object body can be subjected to anisotropic etching without destroying a thin insulation layer included in said object body.

What is claimed is:

1. A reactive ion etching method which comprises the steps of (a) mounting an object of etching comprising a 3-ply structure having a conductive material formed on a semiconductor body with a thin insulation layer interposed therebetween on a pair of mutually facing electrodes provided in a vacuum vessel on which high frequency power is impressed; (b) impressing said high frequency power between said mutually facing electrodes in an atmosphere of a reactive gas to etch said object body; (c) reducing gradually the cathode drop voltage arising in the proximity of the electrode being impressed with high frequency power, immediately before stopping the impression of high frequency power at the end of ion etching and thereby reducing the voltage impressed on the insulation layer included in said object of etching and caused by the reverse flow of an electric charge stored in the lower electrode to such an extent that a voltage impressed on the insulation layer included in the object of etching drops to a lower level than the breakdown voltage of said insulation layer at the stoppage of the impression of said high frequency power; and (d) thereafter stopping the impression of said high frequency voltage.

2. The method according to claim 1, wherein the gradual reduction of said cathode drop voltage is effected, while the pressure of the reactive atmospheric gas is slowly raised to a prescribed level.

3. The method according to claim 1, wherein the gradual reduction of said cathode drop voltage is carried out, while the high frequency voltage is decreased to a prescribed level.

4. The method according to claim 1, wherein an object of etching is constructed by mounting a layer to be etched on a single crystal silicon substrate with an insulation layer interposed therebetween.

5. The method according to claim 1, wherein said insulation layer consists of a thermally oxidized silicon layer and a silicon nitride layer.

6. The method according to claim 1, wherein said object of etching is formed of a polycrystalline silicon layer, an amorphous silicon layer, a refractory metal layer, a silicide compound layer or a laminated pass consisting of the polycrystalline silicon layer, a refractory metal layer, and a silicide compound layer.

* * * * *